(12) United States Patent
Kuo et al.

(10) Patent No.: US 11,488,848 B2
(45) Date of Patent: Nov. 1, 2022

(54) INTEGRATED SEMICONDUCTOR DIE VESSEL PROCESSING WORKSTATIONS

(71) Applicant: Taiwan Semiconductor Manufacturing Co., Ltd., Hsinchu (TW)

(72) Inventors: Tsung-Sheng Kuo, Hsin-Chu (TW); Guan-Wei Huang, Hsin-Chu (TW); Chih-Hung Huang, Hsin-Chu (TW); Yang-Ann Chu, Hsin-Chu (TW); Hsu-Shui Liu, Pingjhen (TW); Jiun-Rong Pai, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 82 days.

(21) Appl. No.: 16/518,352

(22) Filed: Jul. 22, 2019

(65) Prior Publication Data
US 2020/0075371 A1 Mar. 5, 2020

Related U.S. Application Data

(60) Provisional application No. 62/712,656, filed on Jul. 31, 2018.

(51) Int. Cl.
*H01L 21/67* (2006.01)
*H01L 21/66* (2006.01)
*H01L 21/02* (2006.01)

(52) U.S. Cl.
CPC .. *H01L 21/67288* (2013.01); *H01L 21/02057* (2013.01); *H01L 21/67051* (2013.01); *H01L 22/12* (2013.01)

(58) Field of Classification Search
CPC ............. H01L 21/67288; H01L 22/12; H01L 21/02057; H01L 21/67051; H01L 21/67333; H01L 21/67271; H01L 21/6776
See application file for complete search history.

(56) References Cited

U.S. PATENT DOCUMENTS

| 5,794,783 A | * | 8/1998 | Carter ............... H01L 21/67333 206/562 |
| 5,957,293 A | | 9/1999 | Pakeriasamy |
| 6,431,814 B1 | * | 8/2002 | Christensen ...... H01L 21/67271 702/81 |
| 6,474,477 B1 | * | 11/2002 | Chang ............... H01L 21/67333 206/509 |
| 7,795,076 B2 | * | 9/2010 | Arneson et al. |

(Continued)

FOREIGN PATENT DOCUMENTS

| CN | 1990127 A | 7/2007 |
| CN | 102543807 A | 7/2012 |

(Continued)

*Primary Examiner* — Duy Vu N Deo
*Assistant Examiner* — Christopher Remavege
(74) *Attorney, Agent, or Firm* — Duane Morris LLP

(57) ABSTRACT

In certain embodiments, a workstation includes: a cleaning station configured to clean a die vessel, wherein the die vessel is configured to secure a semiconductor die; an inspection station configured to inspect the die vessel after cleaning to determine whether the die vessel is identified as passing inspection; and a conveyor configured to move the die vessel between the cleaning station and the inspection station.

20 Claims, 13 Drawing Sheets

(56) References Cited

U.S. PATENT DOCUMENTS

| | | | |
|---|---|---|---|
| 8,794,613 B2* | 8/2014 | Hofmann | H01L 21/673 269/267 |
| 9,370,807 B2* | 6/2016 | Sakashita | H01L 21/67353 |
| 10,738,935 B2* | 8/2020 | Hsu et al. | |
| 2004/0038510 A1* | 2/2004 | Munakata | H01L 21/02076 438/613 |
| 2004/0179931 A1* | 9/2004 | Peterson | H01L 21/67346 414/801 |
| 2005/0036857 A1* | 2/2005 | Chen | B65G 1/1375 414/279 |
| 2005/0045209 A1* | 3/2005 | Tan | B44C 1/22 134/18 |
| 2006/0078415 A1* | 4/2006 | Bjork | H01L 21/67333 414/802 |
| 2006/0119347 A1* | 6/2006 | Shimada | H05K 13/0084 324/757.01 |
| 2007/0062561 A1* | 3/2007 | Koch | H01L 21/67028 134/18 |
| 2008/0145191 A1* | 1/2008 | Salinas et al. | |
| 2008/0151234 A1* | 1/2008 | Imai et al. | |
| 2009/0035102 A1* | 2/2009 | Zimmerhackl | H01L 21/67769 414/800 |
| 2010/0148793 A1* | 6/2010 | Ito | G01R 31/31905 324/537 |
| 2010/0319730 A1* | 12/2010 | Rebstock | H01L 21/67034 134/19 |
| 2011/0259772 A1* | 1/2011 | Forsyth et al. | |
| 2012/0146678 A1* | 6/2012 | Lanowitz | G01R 31/2893 324/756.07 |
| 2013/0112224 A1* | 1/2013 | Nakaharada et al. | |
| 2013/0241587 A1* | 1/2013 | Chua et al. | |
| 2015/0187622 A1* | 7/2015 | Johnson | H01L 21/68 438/464 |
| 2015/0377796 A1* | 12/2015 | Schlezinger et al. | |
| 2016/0111309 A1* | 4/2016 | Lill | H01L 21/67745 414/217 |
| 2017/0206428 A1* | 1/2017 | Weiss et al. | |
| 2018/0040494 A1* | 2/2018 | Rebstock | H01L 22/12 |
| 2018/0361433 A1* | 12/2018 | Bonora | B25J 15/022 |
| 2019/0363002 A1* | 11/2019 | Lee et al. | |
| 2019/0378734 A1* | 12/2019 | Ehrne | H01L 21/67778 |

FOREIGN PATENT DOCUMENTS

| | | |
|---|---|---|
| CN | 203556618 U | 4/2014 |
| CN | 104854689 A | 8/2015 |
| JP | 4428644 B2 | 3/2010 |
| TW | 201246116 A | 11/2012 |
| TW | 201528406 A | 7/2015 |
| TW | 201812956 A | 4/2018 |

\* cited by examiner

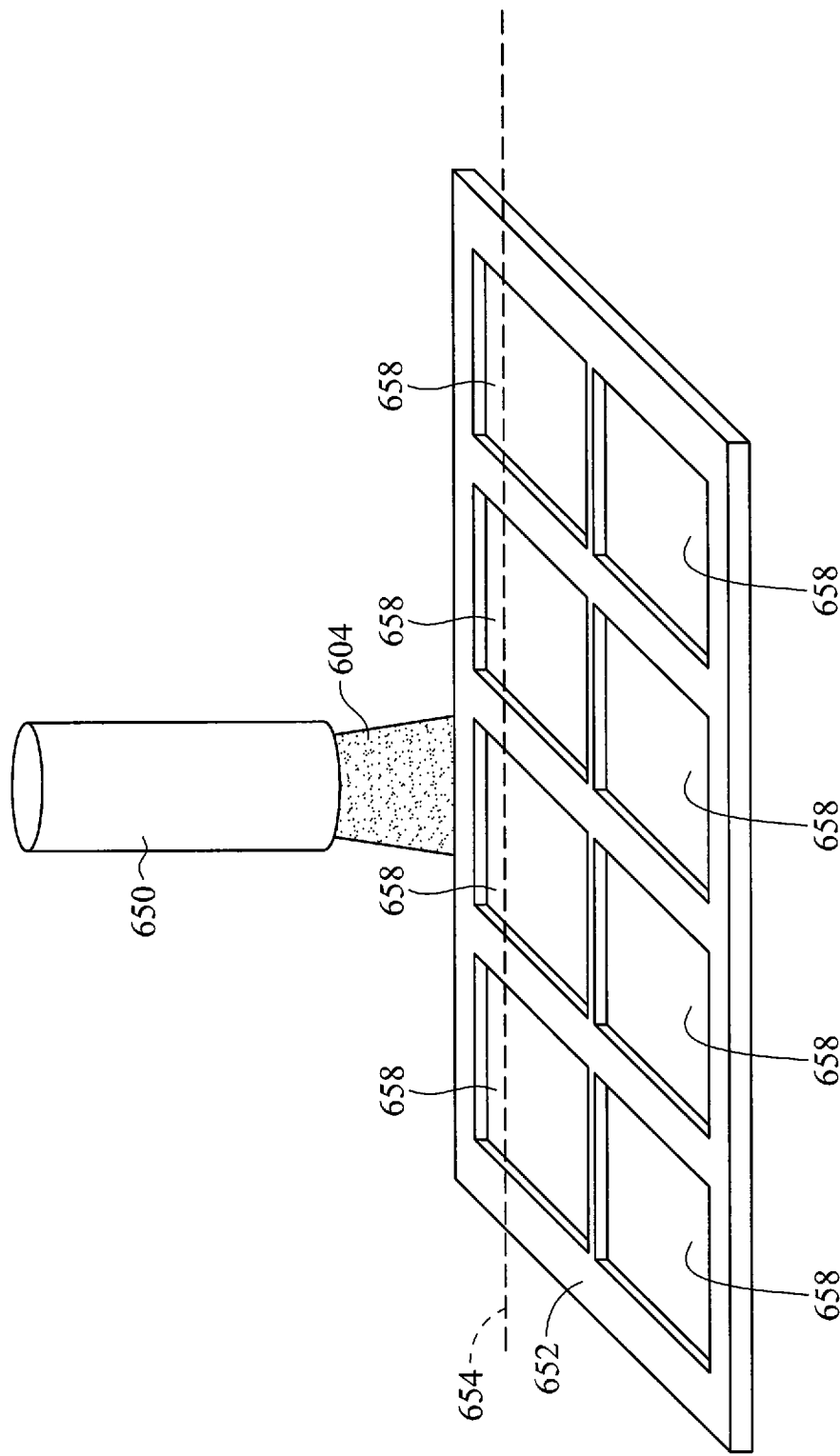

INTEGRATED SEMICONDUCTOR DIE VESSEL PROCESSING WORKSTATIONS

CROSS-REFERENCE TO RELATED APPLICATIONS

The present application claims priority benefit of U.S. Provisional Application No. 62/712,656, filed on Jul. 31, 2018, the contents of which are incorporated by reference in its entirety.

BACKGROUND

Modern manufacturing processes are highly automated to manipulate materials and devices and create a finished product. However, quality control, packaging, and maintenance processes often rely on human skill, knowledge and expertise for processing and inspection of the manufactured product both during manufacture and as a finished product.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 6C is an illustration of a line image sensor configured to produce image data characterizing a bottom plate 52 of a die vessel, in accordance with some embodiments.

DETAILED DESCRIPTION OF EXEMPLARY EMBODIMENTS

Figure 1A:
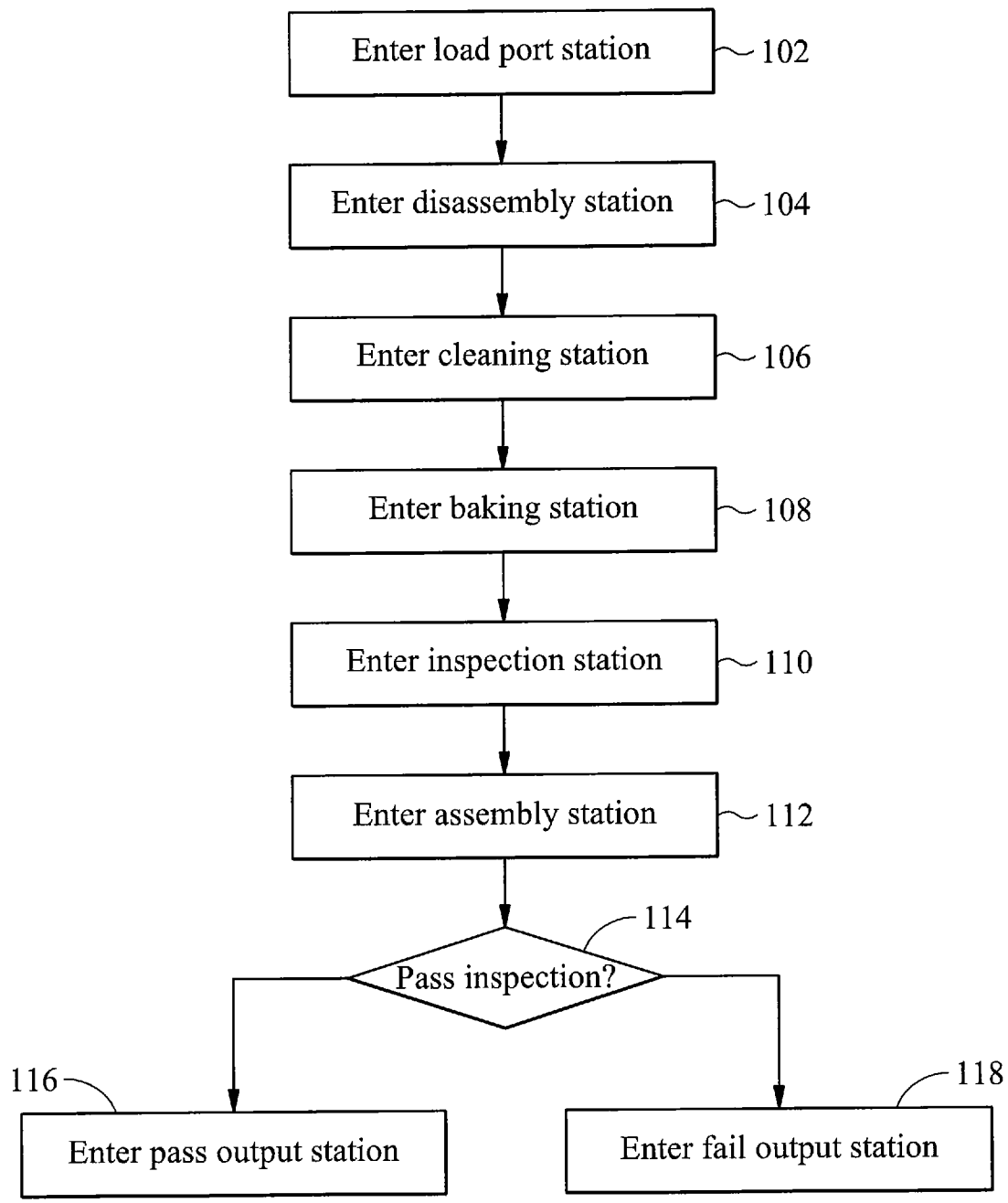
FIG. 1A is a flowchart of an integrated semiconductor die vessel workstation process 100, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Systems and methods in accordance with various embodiments are directed to an automated and integrated semiconductor die vessel processing workstation (e.g., platform) for cleaning and inspection. Typically, die vessels are manually inspected for defects and manually cleaned. Die vessels are containers or vessels for securing semiconductor dies in transport. Semiconductor dies, also referred to more simply as dies, may be singulated chips or dies from a semiconductor wafer. However, in various embodiments, a die vessel may be automatically cleaned and inspected without need for manual intervention. For example, a die vessel may be disassembled, cleaned, dried, inspected and reassembled in an automated fashion at a die vessel processing workstation.

The disassembly may include separating parts of a die vessel for ease of cleaning at a disassembly station. The cleaning may include applying a cleaning fluid at a cleaning station. A heated gas may be applied for drying at a drying station. Inspection may include inspecting the dimensions of the constituent components of the die vessel, gasket(s) of the die vessel, and any other aspect of the disassembled die vessel capable of inspection at an inspection station. The die vessel may then be reassembled from the constituent components of the die vessel at an assembly station. Lastly, the die vessel may be identified as either a die vessel that passes inspection or a die vessel that does not pass inspection. Passing inspection may refer to the die vessel meeting various thresholds as determined during the inspection, such as thresholds for minimum acceptable warpage, distance between pins (e.g., dummy pins), and the presence of gaskets. A die vessel that passes inspection may be directed to a pass output station and a die vessel that does not pass inspection may be directed to a fail output station.

The semiconductor die vessel processing workstation may provide an integrated platform where each station is connected with another in an automated fashion. Each station may be a stationary point or location for processing of a die vessel, from an initial load port station to the final output station, whether a pass output station or a fail output station. Accordingly, die vessels need only be brought to a load port station of the semiconductor die vessel processing workstation to be processed. Then, the die vessels may be disassembled, cleaned, dried, inspected, and reassembled for transport from the semiconductor die vessel processing workstation, all without manual or human intervention by an operator of the semiconductor die vessel processing workstation.

In various embodiments, each station of the semiconductor die vessel processing workstation may be interconnected via a conveyor system. The conveyor system may describe the automated interconnections between the stations to bring the die vessels from one station to another. Accordingly, the conveyor system may form a transport path from which a die vessel may be transported through (e.g., from start to finish) the stations of the die vessel processing workstation. In certain embodiments, the conveyor system may include a system of robotic arms and conveyor belts configured to receive the die vessels at one station and to move the die vessels for receipt (e.g., processing) at another station.

The die vessel be a tray, a boat, a jig or any type of container for the transport of semiconductor dies. A die vessel that includes a bottom plate and a cover may be referred to as a jig. A die vessel that only includes a bottom plate (e.g., no cover) may be referred to as a boat or a tray. The die vessel may be made of any type of material suitable for semiconductor die transport, such as a plastic or a metal. IN particular embodiments, the die vessel may be made of layers of at least one of a polymer, silicon nitride (SiN), and silicon dioxide ($SiO_2$). In certain embodiments, a die vessel that is a jig may have a bottom plate and a cover that is of a same material (e.g., a plastic or a metal). In other embodiments, a die vessel that is a jig may have a bottom plate and a cover that is of different materials (e.g., one that is a plastic and the other that is a metal). Also, in particular embodiments, a bottom plate of a die vessel may include a number of concave receptacles (e.g., pockets) in which individual dies may be placed (e.g., housed). These dies may be, optionally, further adhered in place in virtue of rotatable pin clamp that may contact a top surface of a die while the die rests with a bottom surface on the die vessel.

FIG. 1A is a flowchart of an integrated semiconductor die vessel workstation process 100, in accordance with some embodiments. The integrated semiconductor die vessel workstation process 100 may be performed by an integrated semiconductor die vessel workstation. It is noted that the process 100 is merely an example, and is not intended to limit the present disclosure. Accordingly, it is understood that additional operations may be provided before, during, and after the process 100 of FIG. 1A, certain operations may be omitted, certain operations may be performed concurrently with other operations, and that some other operations may only be briefly described herein.

At operation 102, a die vessel may be brought to a load port station. The load port station may be a point of entry for the integrated semiconductor die vessel workstation. This point of entry may be configured to interface with, for example, an automated material handling system or by manual handling (e.g., deposit) of the die vessel to the load port station.

In various embodiments the load port station may be interfaced with a conveyor system of the integrated semiconductor die vessel workstation. The conveyor system may be an automated system for moving die vessels within the integrated semiconductor die vessel workstation between stations. For ease of explanation, the conveyor system may be referred to separate from the stations (e.g., in reference to a transport path for die vessels that each part of the conveyor system at each station facilitates across the semiconductor die vessel workstation) but, in implementation, the parts of the conveyor system may form part of each individual station. For example, the conveyor system may include various conveyor belts and/or robotic arms. These conveyor belts may be disposed to interlink stations and the robotic arms may, as necessary, move the die containers to and from the conveyor belt and stations and/or from the stations to an automated material handling system. In certain embodiments, the robotic arms may include manipulators to manipulate or move parts of the die vessel, such as for assembly or disassembly.

In certain embodiments, the conveyor belt may be composed of a number of links such that openings within the conveyor belt allow for access to a bottom side of an object (e.g., a die vessel, or disassembled die vessel) being transported by the conveyor belt. In other embodiments, the conveyor belt may contact some but not all of an underside of an object (e.g., a die vessel, or disassembled die vessel) being transferred by the conveyor belt. For example, the conveyor belt may contact the sides of a die vessel in order to move the die vessel. Further discussion of the conveyor belt will be provided below.

At operation 104, the die vessel may enter a disassembly station. The conveyor system may bring the die vessel from the load port station to the disassembly station. The disassembly station may be configured to disassemble the die vessel, as necessary, for cleaning and inspection. As noted above, a die vessel that is a jig may include a cover in addition to a bottom plate. The plate may cover the top of the die vessel such that dies loaded within receptacles of the bottom plate may be secured to the die vessel by having the cover over the bottom plate.

Accordingly, in certain embodiments, the disassembly station may remove the cover from the bottom plate so that the bottom plate may be inspected and cleaned separate from the cover. The cover may be removed from the bottom plate in variety of ways. For example, the cover may be removed via a manipulator (e.g., suction tube) or other structure configured to provide a suction force to a localized area to selectively apply a suction force to the cover to remove the cover from the bottom plate. Then, the removed cover may be placed on the conveyor system (e.g., on a conveyor belt of the conveyor system) for further processing and transport.

In other embodiments, the disassembly station may not take any action in the situations where a die vessel is not a jig, or otherwise does not have a cover in addition to the bottom plate. Accordingly, the die vessels without a cover, or that are not a jig, may pass thorough the disassembly station without processing at the disassembly station.

In various embodiments, a disassembly station may be configured to process a certain type of die vessel. For example, the conveyor system at certain times may be configured to process a die vessel that is a jig (e.g., a die vessel with both a cover and a bottom plate) or a die vessel that is a boat or tray at other times (e.g., a die vessel with only a bottom plate that is the boat or tray and no cover). In various embodiments, the disassembly system may include a die vessel cover sensor to determine whether the die vessel is a jig, a boat, or a tray. For example, the disassembly system may include a die vessel cover sensor that is a weight sensor configured to determine the weight of a boat, tray, or jig, such as where a jig is of a first class of a greatest weight and a boat or tray is of a second class that is a lesser weight. In other embodiments, the die vessel cover sensor may be an image sensor configured to capture an image of the die vessel to determine whether it is a jig (e.g., with a cover) or a boat or tray (e.g., without the cover). A computer readable code or marking (e.g., die vessel identifier) on the die vessel may be read from the image of the die vessel and processed to determine whether the die vessel has a cover or not (e.g., whether it is a jig or a boat/tray). Therefore, based on the die vessel cover sensor, the disassembly station may determine whether to process the die vessel as jig (e.g., to remove the cover) or as a boat or tray (e.g., no need to perform disassembly).

At operation 106, the die vessel may enter a cleaning station. The cleaning station may clean the bottom plate and (as applicable in certain embodiments) the cover of the die vessel. For example, the cleaning station may apply a cleaning fluid (e.g., deionized water, air, or any liquid or gas) to a bottom plate and (as applicable in certain embodiments) the cover of the die vessel. This application of the cleaning fluid may come from above and below the bottom plate and (as applicable in certain embodiments) the cover of the die vessel. The cleaning station may also utilize a brush or other apparatus to physically contact the bottom plate and (as applicable in certain embodiments) the cover so as to clean the bottom plate and the cover.

At operation 108, the die vessel may enter a drying station. The drying station may include the application of gas (e.g., a heated gas) to the die vessel to dry off the die vessel. In certain embodiments, the gas may be heated to a temperature of from about 60 degrees centigrade to about 100 degrees centigrade. In other embodiments, the gas may be set to a temperature of about 10 degrees centigrade to about 150 degrees centigrade. The gas may be, for example, nitrogen gas (e.g., N2) or clean dry air (e.g., ambient air that has been filtered for impurities). In addition, the application of the gas may come from above and below the bottom plate and (as applicable in certain embodiments) the cover of the die vessel.

At operation 110, the die vessel may enter an inspection station. The conveyor system may bring the die vessel from the drying station to the inspection station. The inspection station may be configured to inspect the die vessels for defects. For example, the inspection station may be configured to inspect the die vessel for defects, such as to confirm that the die vessel includes the correct dimensions (e.g., size and shape) and/or if the die vessel has an unexpected surface feature or non-uniformity. In various embodiments, the inspection station may include an image sensor configured to capture image data of a die vessel at known (e.g., predetermined or expected) locations on the die vessel. This image sensor may be, for example, an automated optical inspection (AOI) image sensor and/or a line point image sensor. As will be discussed further below, a remediation step may be performed if there is a defect, such as by moving the defective die vessel associated with the defect to a fail output station of the semiconductor die vessel workstation for remediation. Alternatively, the conveyor system may move the die vessel to a pass output station should no defect be detected.

In certain embodiments, this inspection at the inspection station may inspect whether pins are 0.075 millimeters apart, whether the gaskets on the die vessel are present, and/or whether there is warpage on the die vessel (e.g., along either the bottom plate or the cover) of less than 200 micrometers from a planar orientation. Stated another way, a die vessel may be considered defective should the pins not be about 0.075 millimeters apart, when the gaskets on the die vessel are not present, and/or should warpage be at or more than 200 micrometers from a planar orientation.

At operation 112, the die vessel may enter an assembly station. The conveyor system may bring the die vessel from the inspection station to the assembly station. The assembly station may be configured to assemble the die vessel, as necessary, after cleaning and inspection. As noted above, a die vessel that is a jig may include a cover in addition to a bottom plate. The cover may form a top of the die vessel such that dies loaded within receptacles of the bottom plate may be secured to the die vessel by having the cover over the bottom plate.

Accordingly, in certain embodiments, the assembly station may place (e.g., place back) the cover atop the bottom plate so that the bottom plate may be assembled with the cover. The cover may be placed on the bottom plate in variety of ways. For example, the cover may be moved via a manipulator (e.g., a suction tube) or other structure configured to provide a selective suction force to a localized area to move the cover over the bottom plate and deposit the cover over the bottom plate.

In other embodiments, the assembly station may not take any action in the situations where a die vessel is not a jig, or otherwise does not have a cover in addition to the bottom plate. Accordingly, the die vessels without a cover, or that are not a jig, may pass thorough the assembly station without processing at the assembly station.

In certain embodiments, the assembly station may notate whether the die vessel has a cover or not from processing at the disassembly station. Then, the notation of whether the die vessel has a cover or not may be noted at the assembly station and processed accordingly. For example, as noted above, die vessels without a cover may not be additionally processed at the assembly station. However, die vessels with a cover may be assembled at the assembly station (e.g., where the cover is assembled over the bottom plate).

At operation 114, a decision may be made as to whether the die vessel passed inspection or not. As noted above, the inspection station may be configured to inspect the die vessel for defects, such as to confirm that the die vessel includes the correct dimensions (e.g., size and shape) and/or if they have an unexpected surface feature or non-uniformity. The process 100 may move to operation 116 if there is no defect such that the die vessel passes inspection. The process 100 may move to operation 118 if there is a defect such that the die vessel does not pass or fails inspection.

At operation 116, the conveyor system may move the die vessel that passes inspection (e.g., in which no defects were detected at operation 110) to a pass output station. In certain embodiments, the conveyor system at the pass output station may interact with an automated material handling system to move the die vessel from the pass output station.

At operation 118, the conveyor system may move the die vessel that failed inspection (e.g., that has a detected defect in operation 110) to a fail output station. In certain embodiments, the conveyor system at the fail output station may interact with an automated material handling system to move the die vessel from the fail output station.

Figure 1B:
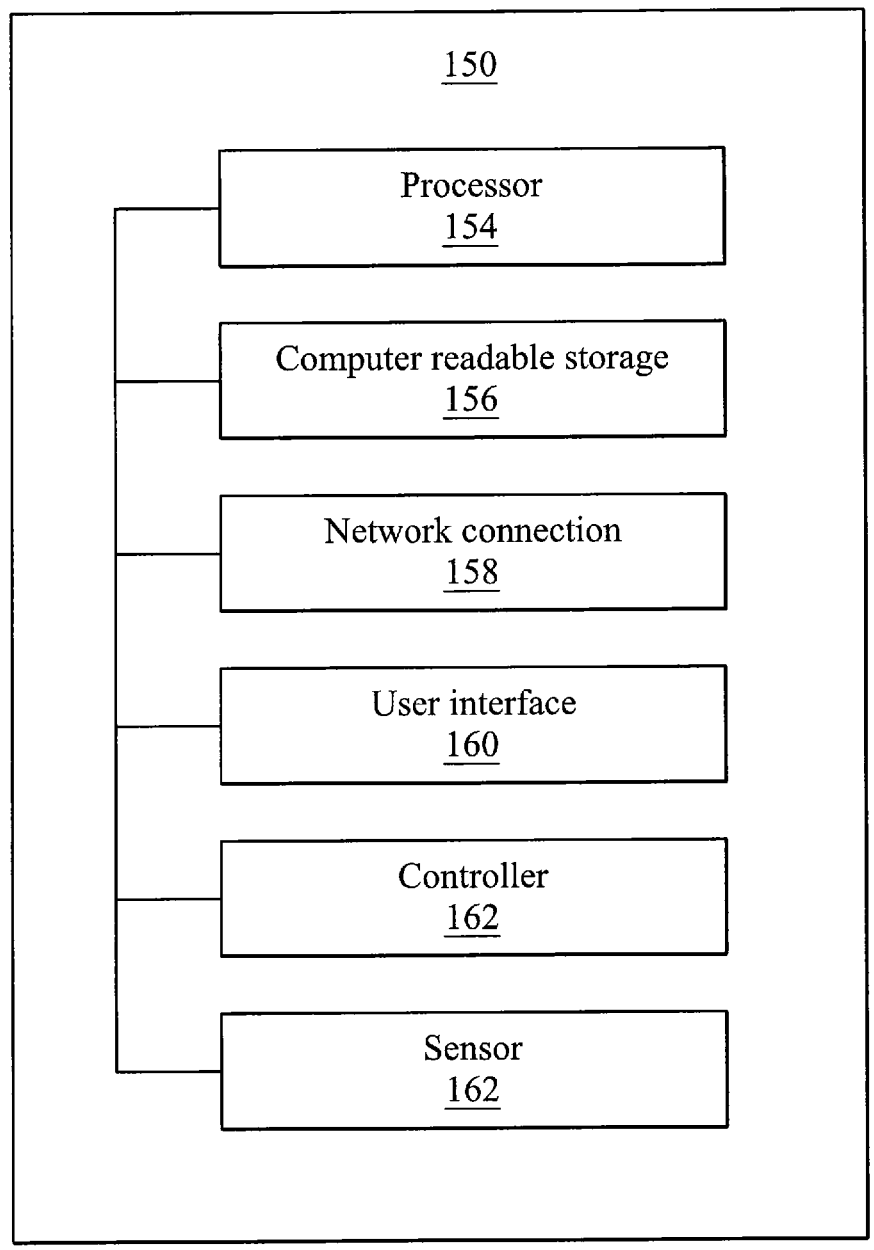
FIG. 1B is a block diagram of various functional modules of an integrated semiconductor die vessel workstation functional module, in accordance with some embodiments.

FIG. 1B is a block diagram of various functional modules of an integrated semiconductor die vessel workstation functional module 150, in accordance with some embodiments. The integrated semiconductor die vessel workstation functional module 150 may be part of an integrated semiconductor die vessel workstation. The integrated semiconductor die vessel workstation functional module 150 may include a processor 154. In further embodiments, the processor 154 may be implemented as one or more processors.

The processor 154 may be operatively connected to a computer readable storage module 156 (e.g., a memory and/or data store), a network connection module 158, a user interface module 160, a controller module 162, and a sensor module 164. In some embodiments, the computer readable storage module 156 may include logic that may configure the processor 154 to perform the various processes discussed herein. The computer readable storage module may also store data, such as sensor data collected by an image sensor of an inspection station, image data for identifying a defect, identifiers for a die, identifiers for a die vessel, identifiers for a sensor, and any other parameter or information that may be utilized to perform the various processes discussed herein.

The network connection module 158 may facilitate a network connection of the integrated semiconductor die vessel workstation with various devices and/or components of the workstation that may communicate within or external to the integrated semiconductor die vessel workstation functional module 150. In certain embodiments, the network connection module 158 may facilitate a physical connection, such as a line or a bus. In other embodiments, the network connection module 158 may facilitate a wireless connection, such as over a wireless local area network (WLAN) by using a transmitter, receiver, and/or transceiver. For example, the network connection module 158 may facilitate a wireless or wired connection with various parts of the integrated semiconductor die vessel workstation.

The integrated semiconductor die vessel workstation functional module 152 may also include the user interface module 160. The user interface module 160 may include any type of interface for input and/or output to an operator of the integrated semiconductor die vessel workstation, including, but not limited to, a monitor, a laptop computer, a tablet, or a mobile device, etc.

The integrated semiconductor die vessel workstation functional module 152 may include a controller module 162. In certain embodiments, the controller module 162 may be implemented by (e.g., be part of) the processor 154. The controller module 162 may be configured to control various physical apparatuses that control movement or functionality of the integrated semiconductor die vessel workstation, such as the conveyor system. For example, the controller module 162 may be configured to control movement or functionality for at least one of a conveyor belt, robotic arm, and the like. For example, the controller module 162 may control a motor that may move at least one of a conveyor belt and/or a robotic arm. The controller module 162 may be controlled by the processor 154 and may carry out the various aspects of the various processes discussed herein.

The integrated semiconductor die vessel workstation functional module 152 may include a sensor module 164. The sensor module 164 may represent a sensor configured to collect sensor data that may be utilized to defects and/or a die vessel cover. For example, the sensor module 164 may represent a die vessel cover sensor configured for inspection of the presence of a die vessel cover and/or an inspection sensor (e.g., image sensor at an inspection station) configured for inspection of the die vessel for defects.

Figure 2A:
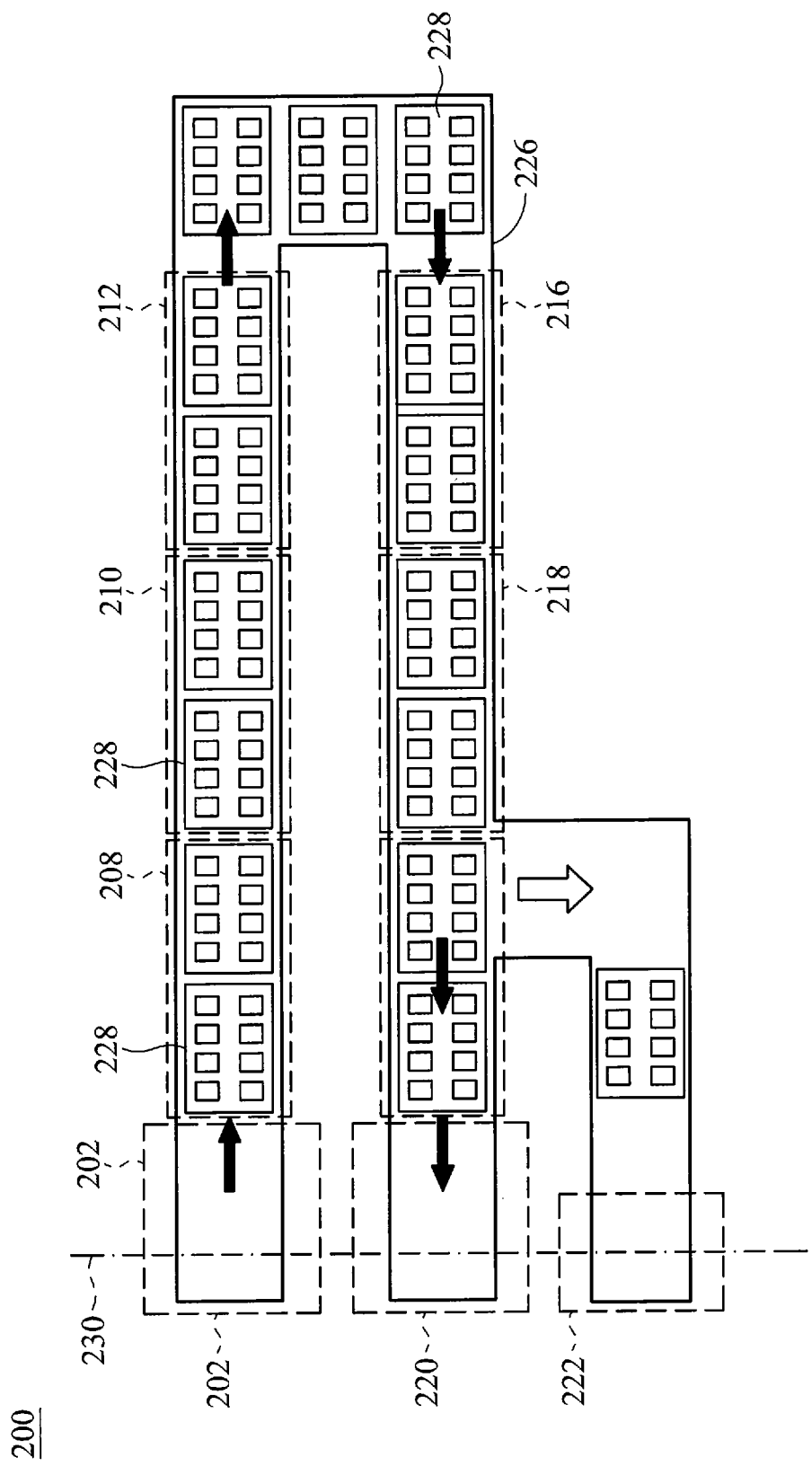
FIG. 2A is a diagram of an integrated semiconductor die vessel workstation, in accordance with some embodiments.

FIG. 2A is a diagram of an integrated semiconductor die vessel workstation 200, in accordance with some embodiments. The integrated semiconductor die vessel workstation 200 may include multiple stations 202-222 that are connected via a conveyor system 226. The conveyor system 226 may describe the automated interconnections at and between the stations 202-222 to bring the die vessels 228 to and/or from the stations 202-222. In certain embodiments, the conveyor system may convey die vessels 228 via conveyor belts configured to receive the die vessels at one station and to move the die vessels for receipt (e.g., processing) at another station. The conveyor belt may represent any physical apparatus configured for substantially lateral motion, such as a conveyor belt with rollers and pulleys that may transport die vessels across a top surface of the conveyor belt. For example, the conveyor system 226 may connect, in order, a load port station 202, a disassembly station 208, a cleaning station 210, a drying station 212, an inspection station 216, an assembly station 218, and either a pass output station 220 or a fail output station 222. Each station may be a stationary point or location for processing a die vessel 228 in the course of being processed by the semiconductor die vessel workstation 200, from the initial load port station 202 to the final pass output station 220 or fail output station 222. For emphasis, the die vessel 228 is illustrated in various places as it is moved along the semiconductor die vessel workstation 200 in the direction of the arrows overlaying the die vessel 228. In addition, an automated material handling system 230 may be configured to move a die vessel to and/or from the initial load port station 202, the final pass output station 220, and/or the final fail output station 222. The automated material handling system 230 may include, for example, robotic arms, automated guided vehicles, and/or any other mechanism for manipulating and moving die vessels at the initial load port station 202, the final pass output station 220, and/or the fail output station 222.

Accordingly, the integrated semiconductor die vessel workstation may provide an integrated platform where each station is connected with another in an automated fashion. A die vessel need only be brought to a load port station of the integrated semiconductor die vessel workstation to be processed. Then, the die vessels may be disassembled, cleaned, dried, inspected, reassembled and categorized (e.g., via placement in the pass output station 220 and/or fail output station 222) for transport from the integrated semiconductor die vessel workstation, all without manual or human intervention by an operator of the integrated semiconductor die vessel workstation.

In various embodiments, the load port station 202 may be a point of entry for the semiconductor die vessel workstation 200. This point of entry may be configured to interface with, for example, an automated material handling system 230 or by manual handling (e.g., deposit) of the die vessel 228 to the load port station 202.

In various embodiments the load port station may be interfaced with a conveyor system 226 of the integrated semiconductor die vessel workstation 200. The conveyor system may be an automated system for moving die vessels within the integrated semiconductor die vessel workstation 200 between stations 202-222. For example, the conveyor system 226 may include various conveyor belts. These conveyor belts may be disposed to interlink stations 202-222 so that the die vessel may travel along a path provided by the conveyor belts. In certain embodiments, the conveyor system 226 may include robotic arms that may move the die containers and/or parts of the die containers, to and from the conveyor belt and stations and/or from the stations to an automated material handling system.

In certain embodiments, the conveyor belt may be composed of a number of links such that openings within the conveyor belt allow for access to a bottom side of an object being transported by the conveyor belt. In other embodiments, the conveyor belt may contact some but not all of an underside of an object being transferred by the conveyor belt. For example, the conveyor belt may contact the sides of a die vessel 228 in order to move the die vessel 228.

The conveyor system 226 may bring a die vessel 228 from the load port station 202 to the disassembly station 208. The disassembly station 208 may be configured to disassemble the die vessel 228, as necessary, for cleaning and inspection. As noted above, a die vessel 228 that is a jig may include a cover in addition to a bottom plate. The cover may form a top of the die vessel such that dies loaded within receptacles of the bottom plate may be secured to the die vessel by having the cover over the bottom plate.

Accordingly, in certain embodiments, the disassembly station 208 may remove the cover from the bottom plate so that the bottom plate may be inspected and cleaned separate from the cover. The cover may be removed from the bottom plate in variety of ways. For example, the cover may be removed via a manipulator (e.g., a suction tube) or other structure configured to provide a selective suction force to a localized area to remove the cover from the bottom plate. Then, the removed cover may be placed on the conveyor system for further processing. For example, the removed cover may be placed on the conveyor system proximate to the bottom plate to be transported with the bottom plate In other embodiments, the disassembly station 208 may not take any action in the situations where a die vessel 228 is not a jig, or otherwise does not have a cover in addition to the bottom plate. Accordingly, the die vessels 228 without a cover, or that are not a jig, may pass thorough the disassembly station 208 without processing at the disassembly station 208.

In various embodiments, a disassembly station 208 may be configured to process a certain type of die vessel 228. For example, the conveyor system 226 at certain times may be configured to process a die vessel 228 that is a jig (e.g., a die vessel with both a cover and a bottom plate) or a die vessel 228 that is a boat or tray at other times (e.g., a die vessel with only a bottom plate that is the boat or tray with no cover). In various embodiments, the disassembly station 208 may include a die vessel cover sensor to determine whether the die vessel 228 is a jig, a boat, or a tray. For example, the disassembly station 208 may include a die vessel cover sensor that is a weight sensor configured to determine the weight of a boat, tray, or jig, such as where a jig is of a first class of a greatest weight and a boat or tray is of a second class that is a lesser weight. In other embodiments, the die vessel 228 cover sensor may be an image sensor configured to capture an image of the die vessel 228 to determine whether it is a jig (e.g., with a cover) or a boat or tray (e.g., without the cover). A computer readable code or marking (e.g., die vessel identifier) on the die vessel may be read from the image of the die vessel and processed to determine whether the die vessel has a cover or not (e.g., whether it is a jig or a boat/tray). Therefore, based on the die vessel cover sensor, the disassembly station 208 may determine whether to process the die vessel 228 as jig (e.g., to remove the cover) or as a boat or tray (e.g., without disassembly). As noted above, the removed cover may be placed on the conveyor system proximate to the bottom plate to be transported with the bottom plate.

The conveyor system 226 may bring the die vessel 228 from the disassembly station 208 to the cleaning station 210. The cleaning station 210 may clean the bottom plate and (if applicable) the cover of the die vessel 228. For example, the cleaning station 210 may apply a cleaning fluid (e.g., deionized water, air, or any liquid or gas) to a bottom plate and (as applicable in certain embodiments) the cover of the die vessel 228. This application of the cleaning fluid may come from above and below the bottom plate and (as applicable in certain embodiments) the cover of the die vessel 228. The cleaning station 210 may also utilize a brush or other apparatus to physically contact the bottom plate and (as applicable in certain embodiments) the cover so as to clean the bottom plate and the cover.

The conveyor system 226 may bring the die vessel 228 from the cleaning station 210 to a drying station 212. The drying station 212 may include the application of gas (e.g., a heated gas) to the die vessel to dry off the die vessel. In certain embodiments, the gas may be heated to a temperature of from about 60 degrees centigrade to about 100 degrees centigrade. The gas may be, for example, nitrogen gas (e.g., N2) or clean dry air. In addition, the application of the gas may come from above and below the bottom plate and (if applicable) the cover of the die vessel 228. In certain embodiments, the gas may be applied to the bottom plate and the cover to dry off the die vessel.

The conveyor system 226 may bring the die vessel 228 from the drying station 212 to the inspection station 216. The inspection station 216 may be configured to inspect the die vessels 228 for defects. For example, the inspection station 216 may be configured to inspect the die vessel 228 for defects, such as to confirm that the die vessel 228 includes the correct dimensions (e.g., size and shape) and/or if the die vessel 228 has an unexpected surface feature or non-uniformity. In various embodiments, the inspection station may include an image sensor configured to capture image data of the die vessel at known (e.g., predetermined or expected) locations on the die vessel. This image sensor may be, for example, an automated optical inspection (AOI) image sensor and/or a line point image sensor. As will be discussed further below, a remediation step may be performed if there is a defect, such as by moving via the conveyor system 226 the defective die vessel associated with the defect to the fail output station 222 of the integrated semiconductor die vessel workstation 200 for remediation. Alternatively, the conveyor system 226 may move the die vessel 228 to a pass output station 220 should no defect be detected. In certain embodiments, the inspection station may inspect to the bottom plate and the cover in the course of inspecting the die vessel. In other embodiments, the inspection station may inspect only the bottom plate and not the cover in the course of inspecting the die vessel.

In certain embodiments, this inspection at the inspection station 216 may be an inspection of whether pins are 0.075 millimeters apart, whether a gasket at the die vessel is present, and/or whether there is warpage on the die vessel (e.g., along either the bottom plate or the cover) of less than 200 micrometers from a planar orientation. Stated another way, a die vessel 228 may be considered defective should the pins not be 0.075 millimeters apart, should there not be a gasket on the die vessel, and/or should warpage be at or more than 200 micrometers from a planar orientation.

The conveyor system 226 may bring the die vessel 228 from the inspection station 216 to the assembly station 218. The assembly station 218 may be configured to assembly the die vessel 228, as necessary, after inspection. As noted above, a die vessel 228 that is a jig may include a cover in addition to a bottom plate. The plate may cover the top of the die vessel 228 such that dies loaded within receptacles of the bottom plate may be secured to the die vessel 228 by having the cover over the bottom plate.

Accordingly, in certain embodiments, the assembly station 218 may place (e.g., place back) the cover atop the bottom plate so that the bottom plate may be assembled with the cover. The cover may be placed on the bottom plate in variety of ways. For example, the cover may be moved via a manipulator (e.g., a suction tube) or other structure configured to provide a selective suction force to the cover to move the cover over the bottom plate and deposit the cover over the bottom plate. As noted above, the removed cover (e.g., removed at the disassembly station 208) may be placed on the conveyor system proximate to the bottom plate to be transported with the bottom plate to the assembly station 218. In certain embodiments, the removed cover may also undergo In other embodiments, the assembly station 218 may not take any action in the situations where a die vessel 228 is not a jig, or otherwise does not have a cover in addition to the bottom plate. Accordingly, the die vessels 228 without a cover, or that are not a jig, may pass thorough the assembly station 218 without processing at the assembly station 218.

In certain embodiments, the assembly station 218 may have access to information characterizing whether the die vessel has a cover or not from the processing at the disassembly station 208. For example, the notation of whether the die vessel has a cover or not may be noted (e.g., recorded) at the disassembly station and then transferred to the assembly station. As noted above, die vessels 228 without a cover may not be additionally processed at the assembly station 218. However, die vessels 228 with a cover may be assembled at the assembly station 218 (e.g., where the cover is assembled over the bottom plate). In various embodiments, the assembly station 218 may assemble a die vessel irrespective of whether the die vessel passes or fails inspection.

The conveyor system 226 may move the die vessel 228 that passes inspection (e.g., in which no defects were detected during the inspection at the inspection station 216) to a pass output station 220. In certain embodiments, the conveyor system 226 at the pass output station 220 may interact with an automated material handling system 230 to move the die vessel 228 from the pass output station. Alternatively, the conveyor system 226 may move the die vessel 228 that failed inspection (e.g., in which defects were detected during the inspection at the inspection station 216) to a fail output station 222. In certain embodiments, the conveyor system 226 at the fail output station may interact with the automated material handling system 230 to move the die vessel 228 from the fail output station 222.

Figure 2B:
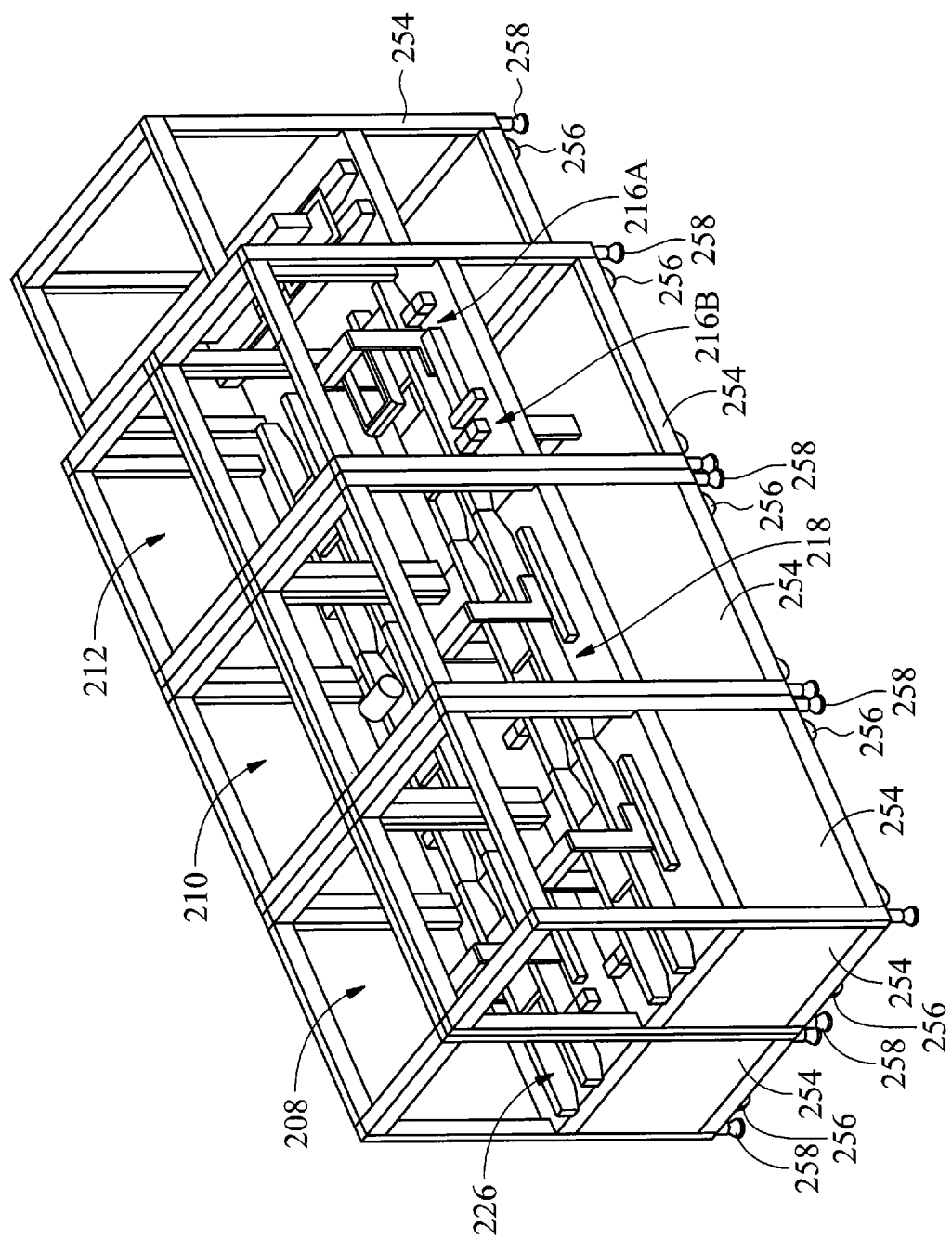
FIG. 2B is a perspective view illustration of a processing stations part of the semiconductor die vessel workstation, in accordance with some embodiments.

FIG. 2B is a perspective view illustration of a processing stations part 250 of the semiconductor die vessel workstation, in accordance with some embodiments. The processing stations part 250 may include the disassembly station 208, the cleaning station 210, the drying station 212, an automated optical inspection (AOI) image sensor station 216A of the inspection station, a line point image sensor 216B of the inspection station, and an assembly station 218.

Also, each of the stations 208-218 may be configured to be moved around in a modular fashion. For example, each of the stations 208-210 may be on top of a base 254 which includes wheels 256 and a leveler foot 258. The wheels 256 may allow a station to be moved around (e.g., wheeled around). Also, the leveler foot 258 may be configured to anchor a station in place as desired. For example, each of the leveler foot 258 and the wheels 256 may be attached to a bottom of the base 254. The leveler foot may be configured to extend (e.g., via rotation within the context of threads of screws) from the bottom of the base to a height greater than a height of the wheel, thus lifting the wheel off the ground and securing the base to the ground in an immobile manner. Alternatively, the leveler foot may be configured to extend (e.g., via rotation within the context of threads of screws) from the bottom of the base to a height smaller than a height of the wheel such that the wheel may touch the ground, thus allowing the base to be moved via rotational movement of the wheels that contact the ground.

Figure 3:
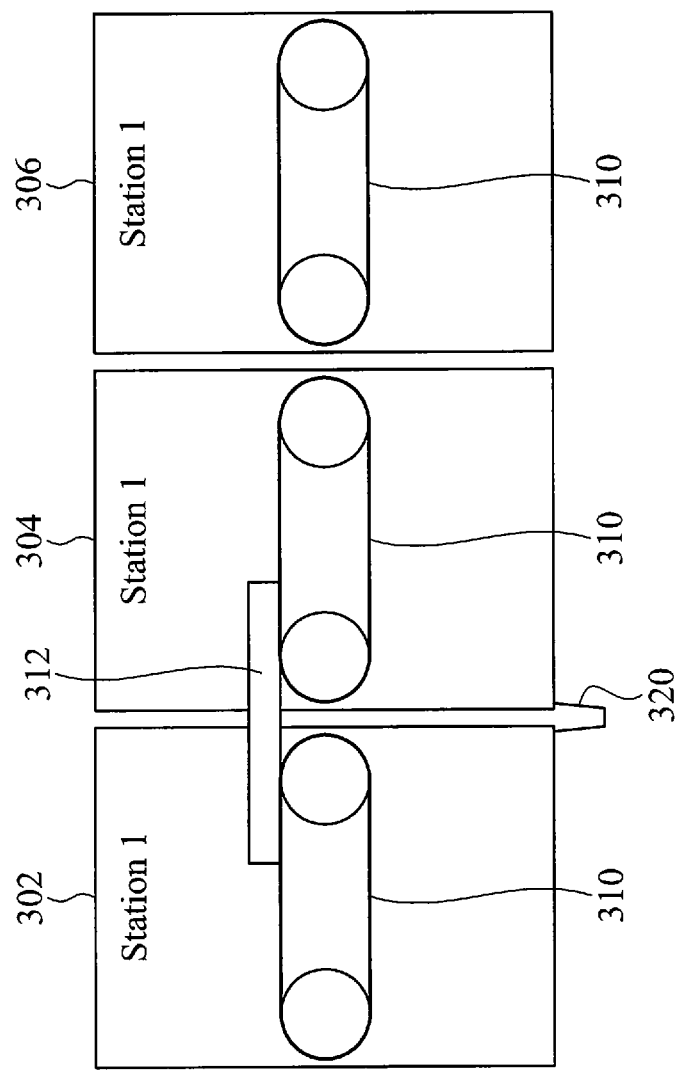
FIG. 3 is an illustration of stations aligned with each other such that the parts of the conveyor system are capable of conveying a die vessel from one station to another, in accordance with some embodiments.

In various embodiments, parts of the conveyor system may be located at each of the stations. Accordingly, the stations may be aligned such that the parts of the conveyor system at the respective stations are aligned sufficiently for conveyance of a die vessel from one station to another. FIG. 3 is an illustration of stations aligned with each other such that the parts of the conveyor system are capable of conveying a die vessel from one station to another, in accordance with some embodiments. As illustrated, a first station 302, second station 304, and third station 306 may be aligned such that the conveyor belts 310 of their respective conveyor systems are at a same level and are close enough so that a die vessel 312 may move from one conveyor belt on one station to another conveyor belt on another station. In certain embodiments, the distance 320 between stations may be about 10 millimeters, or from about 1 millimeter to about 100 millimeters.

Figure 4A:
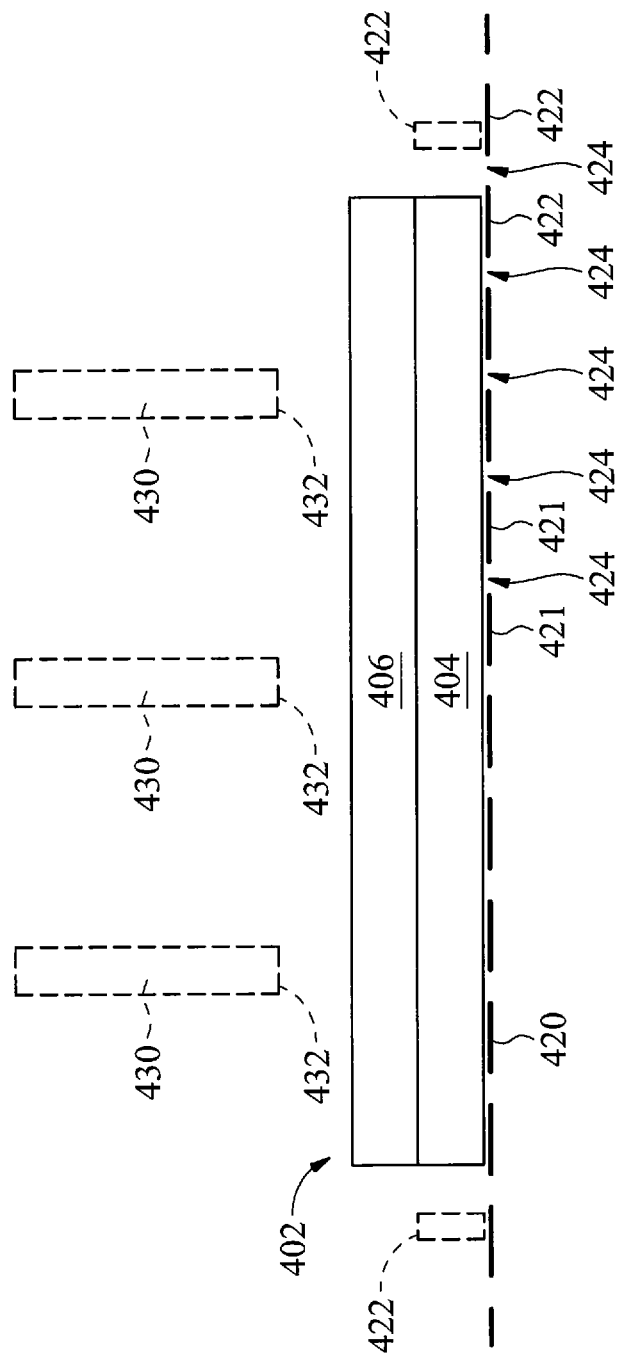
FIG. 4A is an illustration of an jig when assembled, in accordance with some embodiments.

FIG. 4A is an illustration of a jig 402 when assembled, in accordance with some embodiments. As noted above, the assembled jig 402 may be a type of die vessel. The assembled jig 402 may include a bottom plate 404 and a cover 406. The jig 402 may be moved along a conveyor belt 420 of a conveyor system. The conveyor belt 420 (e.g., the belt of the conveyor belt 420) may include intermittent pieces 421 that are flexibly strung together such that various openings 424 persist in the conveyor belt 420. As will be discussed further below, cleaning and/or drying of the bottom side of the bottom plate 404 may be facilitated via these openings 424. In particular embodiments, guide pins 422 may be located to the sides of the bottom plate 404 to delineate where the bottom plate is to be placed on the conveyor belt 420. In various embodiments, the guide pins may move with the conveyor belt 420 (e.g., in the direction of motion of the conveyor belt, such as from left to right). In certain embodiments, the cover 406 may be set in place over the bottom plate 404 via structural interlocking features (not illustrated for simplicity of illustration) between the cover 406 and the bottom plate 404.

In further embodiments, at least one manipulator 430 (illustrated in phantom as it is not part of the jig 402) may be utilized to move the cover from over the bottom plate. This manipulator 430 may be part of a disassembly station and/or assembly station and may contact and secure the cover 406 via a suction force at an end 432 of the manipulator 430 that may selectively adhere the cover 406 to the manipulator 430 (e.g., via selective application of suction forces) so that the manipulator 430 may move the cover from the bottom plate 404.

Figure 4B:
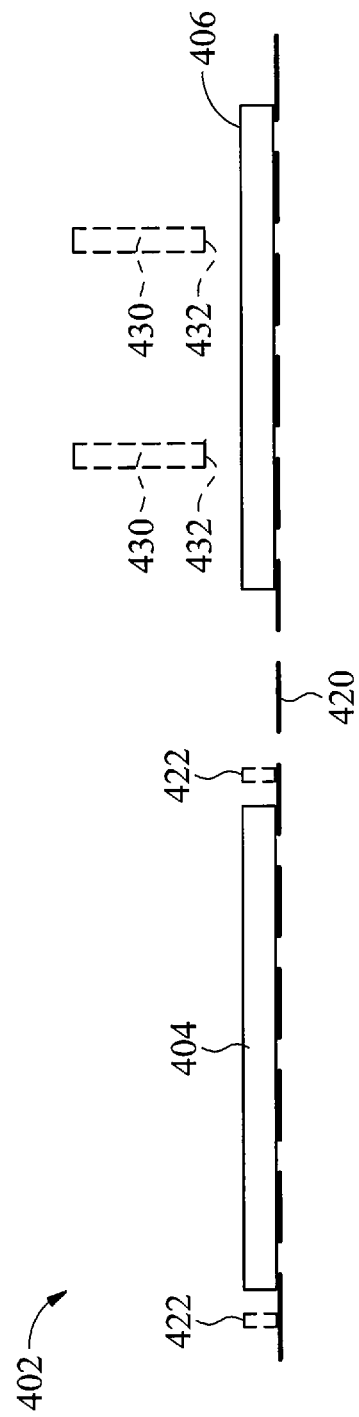
FIG. 4B is an illustration of the jig when disassembled, in accordance with some embodiments.

FIG. 4B is an illustration of the jig 402 when disassembled, in accordance with some embodiments. When disassembled, the jig 402 may be separated into its constituent components (e.g., the cover 406 and the bottom plate 404) such that the cover 406 is not atop the bottom plate 404. Furthermore, both the cover and the bottom plate may be placed on the conveyor belt 420 for conveyance across the integrated semiconductor die vessel workstation 200. As noted above, at least one manipulator 430 may be utilized to move the cover 406 from on top of the bottom plate 404 and back on top of the bottom plate 404 as desired via selective application of suction forces and movement of the at least one manipulator 430.

Figure 5A:
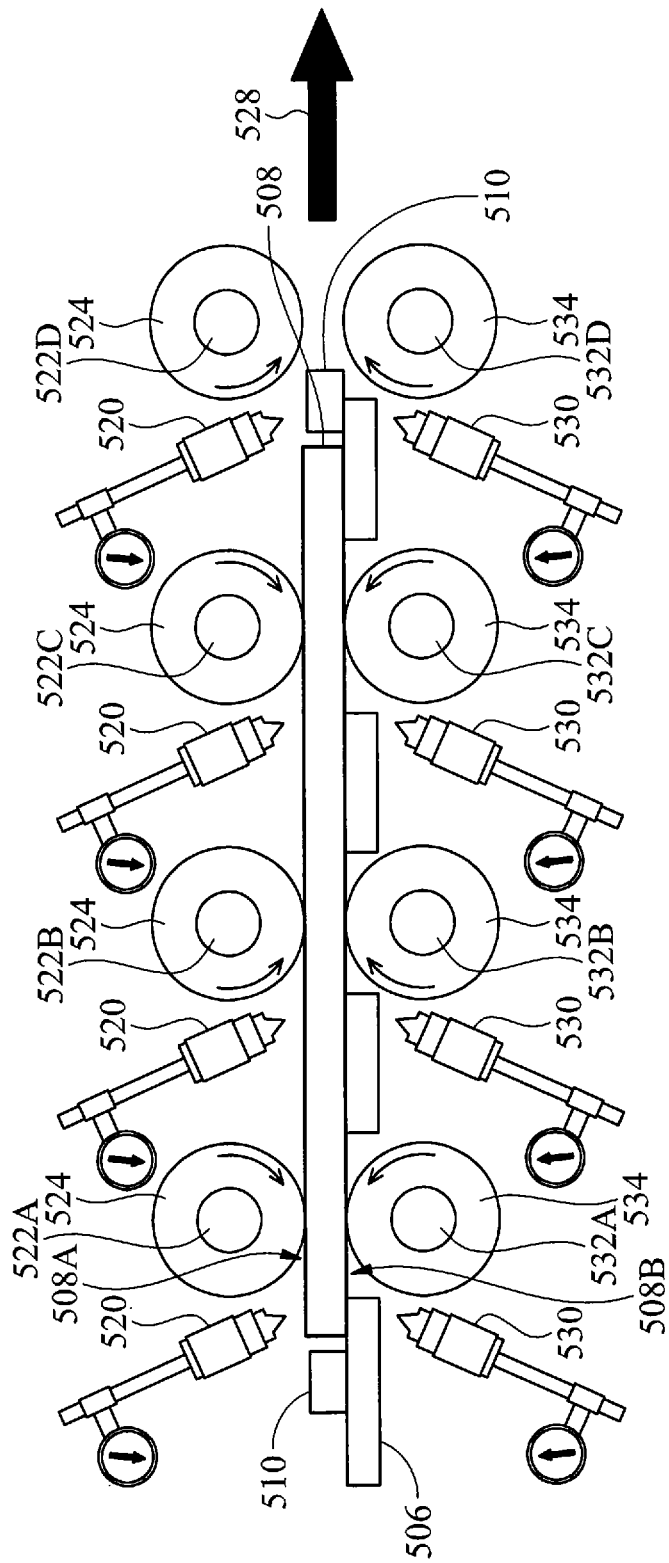
FIG. 5A is an illustration of how cleaning is performed by a cleaning station, in accordance with some embodiments.

FIG. 5A is an illustration of how cleaning is performed by a cleaning station 502, in accordance with some embodiments. A conveyor belt 504 of a conveyor system may run through the cleaning station 502. The die vessel 508 (e.g., the bottom plate of a die vessel 508) may be disposed on the conveyor belt 504 within a space on the conveyor belt 504 between guide pins 510. As noted above, in certain embodiments, the guide pins 510 may be fixed with the conveyor belt 504 and may move along with the conveyor belt 504.

As noted above, the conveyor belt 504 may include intermittent pieces 506 that are flexibly strung together such that various openings persist in the conveyor belt 504 between the pieces 506. Accordingly, various nozzles and brushes may be disposed above and below the die vessel 508 (e.g., the bottom plate of a die vessel 508) to clean the die vessel 508. In certain embodiments, the nozzles may be configured to dispense cleaning fluid with droplets that are smaller than 20 micrometers in diameter. Thus, in certain embodiments, the cleaning fluid droplets may be configured to clean particles on the dies that are less than 20 micrometers in diameter as well. Also, the expulsion of the cleaning fluid from the nozzles may be pressurized such that the cleaning fluid is sprayed (e.g., ejected) from the nozzles onto the die vessel 508. For example, top side nozzles 520 may be configured to dispense cleaning fluid (e.g., deionized water, air, or any liquid or gas) onto a top side 508A of the die vessel 508. In certain embodiments, the cleaning fluid may be dispensed not at an angle normal to the top side 508A of the die vessel 508. Also, top side brushes 522A, 5522B, 522C, 522D may be configured to contact the die vessel 508 to perform cleaning by mechanical contact of the bristles 524 of the top side brushes 522A, 5522B, 522C, 522D on the top side 508A of the die vessel 508. In various embodiments, the top side brushes 522A, 5522B, 522C, 522D may be configured to be spun around in a clockwise or counterclockwise manner. For example, each of the top side brushes 522A, 522B, 522C, 522D that the die vessel 508 encounters as it moves within the cleaning station 502 along a direction of travel 528 (e.g., the forward motion of the conveyor belt 504) may be configured to rotate in an alternating clockwise and counterclockwise direction. In certain embodiments, the rotation may be for at or more than 20 degrees in a single continuous motion before stopping. For example, top side brush 522A may be configured to rotate in a clockwise direction, top side brush 522B may be configured to rotate in a counterclockwise direction, top side brush 522C may be configured to rotate in a clockwise direction, and top side brush 522D may be configured to rotate in a counterclockwise direction.

In certain embodiments, bottom side nozzles 530 may be configured to dispense cleaning fluid (e.g., deionized water, air, or any liquid or gas) onto a bottom side 508B of the die vessel 508. In certain embodiments, the nozzles may be configured to dispense cleaning fluid with droplets that are smaller than 20 micrometers in diameter. Thus, in certain embodiments, the cleaning fluid droplets may be configured to clean particles on the dies that are less than 20 micrometers in diameter as well. Also, the expulsion of the cleaning fluid from the nozzles may be pressurized such that the cleaning fluid is sprayed (e.g., ejected) from the nozzles onto the die vessel 508. In certain embodiments, the cleaning fluid may be dispensed not at an angle normal to the bottom side 508B of the die vessel 508. Also, bottom side brushes 532A, 532B, 532C, 532D may be configured to contact the die vessel 508 to perform cleaning by mechanical contact of the bristles 534 of the bottom side brushes 532A, 532B, 532C, 532D on the bottom side 508B of the die vessel 508. In various embodiments, the bottom side brushes 532A, 532B, 532C, 532D may be configured to be spun around in a clockwise or counterclockwise manner. For example, each of the bottom side brushes 532A, 532B, 532C, 532D that the die vessel 508 encounters as it moves within the cleaning station 502 along the direction of travel 528 (e.g., the forward motion of the conveyor belt 504) may be configured to rotate in an alternating clockwise and counterclockwise direction. In certain embodiments, the rotation may be for at or more than 20 degrees in a single continuous motion before stopping. For example, bottom side brush 532A may be configured to rotate in a clockwise direction, bottom side brush 532B may be configured to rotate in a counterclockwise direction, bottom side brush 532C may be configured to rotate in a clockwise direction, and bottom side brush 532D may be configured to rotate in a counterclockwise direction.

Figure 5B:
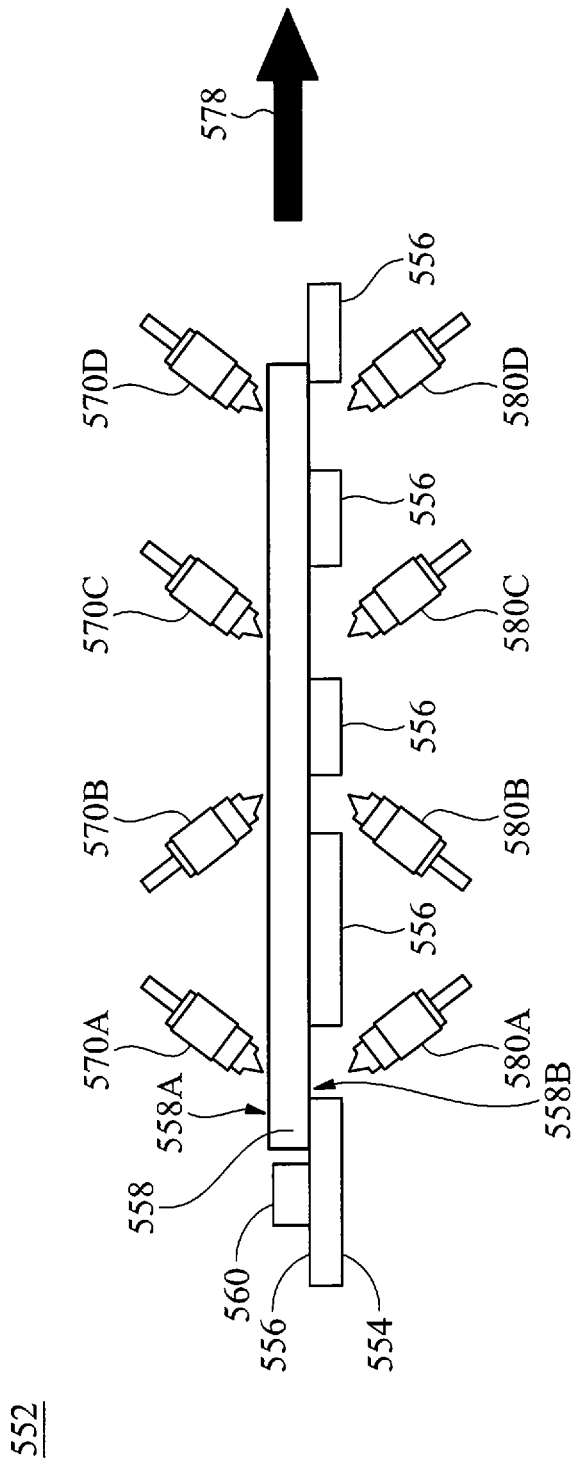
FIG. 5B is an illustration of how drying is performed by a drying station, in accordance with some embodiments.

FIG. 5B is an illustration of how drying is performed by a drying station 552, in accordance with some embodiments. A conveyor belt 554 of a conveyor system may run through the drying station 552. The die vessel 558 (e.g., the bottom plate of a die vessel 558) may be disposed on the conveyor belt 554 within a space on the conveyor belt 554 delineated by at least one guide pin 560.

As noted above, the conveyor belt 554 may include intermittent pieces 556 that are flexibly strung together such that various openings persist in the conveyor belt 554 between the pieces 556. In certain embodiments, the various openings may be of different sizes (e.g., non-uniform). Accordingly, various gas nozzles may be disposed above and below the die vessel 558 (e.g., the bottom plate of a die vessel 558) to dry the die vessel 558. For example, top side gas nozzles 570A-570D may be configured to dispense a drying gas (e.g., clean dry air or nitrogen ($N_2$) gas) onto a top side 558A of the die vessel 558. Also, the drying gas may be heated to a range of about 60 degrees centigrade to about 100 degrees centigrade. In certain embodiments, the drying gas may be dispensed not at an angle normal to the top side 558A of the die vessel 558. For example, some of the top side gas nozzles 570A-570D that the die vessel 558 encounters as it moves within the drying station 552 along a direction of travel 578 (e.g., the forward motion of the conveyor belt 554) may be configured to be left or right facing. For example, top side gas nozzle 570A may be configured to face a left side at an angle (e.g., be configured to dispense gas toward a left angled direction along the top side 558A of the die vessel 558), top side gas nozzle 570B may be configured to face a right side at an angle (e.g., be configured to dispense gas toward a right angled direction along the top side 558A of the die vessel 558), top side gas nozzle 570C may be configured to face a left side at an angle (e.g., be configured to dispense gas toward a left angled direction along the top side 558A of the die vessel 558), and top side gas nozzle 570D may be configured to face a left side at an angle (e.g., be configured to dispense gas toward a left angled direction along the top side 558A of the die vessel 558).

In certain embodiments, bottom side gas nozzles 580A-580D may be configured to dispense a drying gas (e.g., clean dry air or nitrogen ($N_2$) gas) onto a bottom side 558B of the die vessel 558. In certain embodiments, the drying gas may be dispensed not at an angle normal to the bottom side 558B of the die vessel 558. For example, the bottom side gas nozzles 580A-580D that the die vessel 558 encounters as it moves within the drying station 552 along the direction of travel 578 (e.g., the forward motion of the conveyor belt 554) may be configured to be left or right facing. For example, bottom side gas nozzle 580A may be configured to face a left side at an angle (e.g., be configured to dispense gas toward a left angled direction along the bottom side 558B of the die vessel 558), bottom side gas nozzle 580B may be configured to face a right side at an angle (e.g., be configured to dispense gas toward a right angled direction along the bottom side 558B of the die vessel 558), bottom side gas nozzle 580C may be configured to face a left side at an angle (e.g., be configured to dispense gas toward a left angled direction along the bottom side 558B of the die vessel 558), and bottom side gas nozzle 580D may be configured to face a left side at an angle (e.g., be configured to dispense gas toward a left angled direction along the bottom side 558B of the die vessel 558).

Figure 6A:
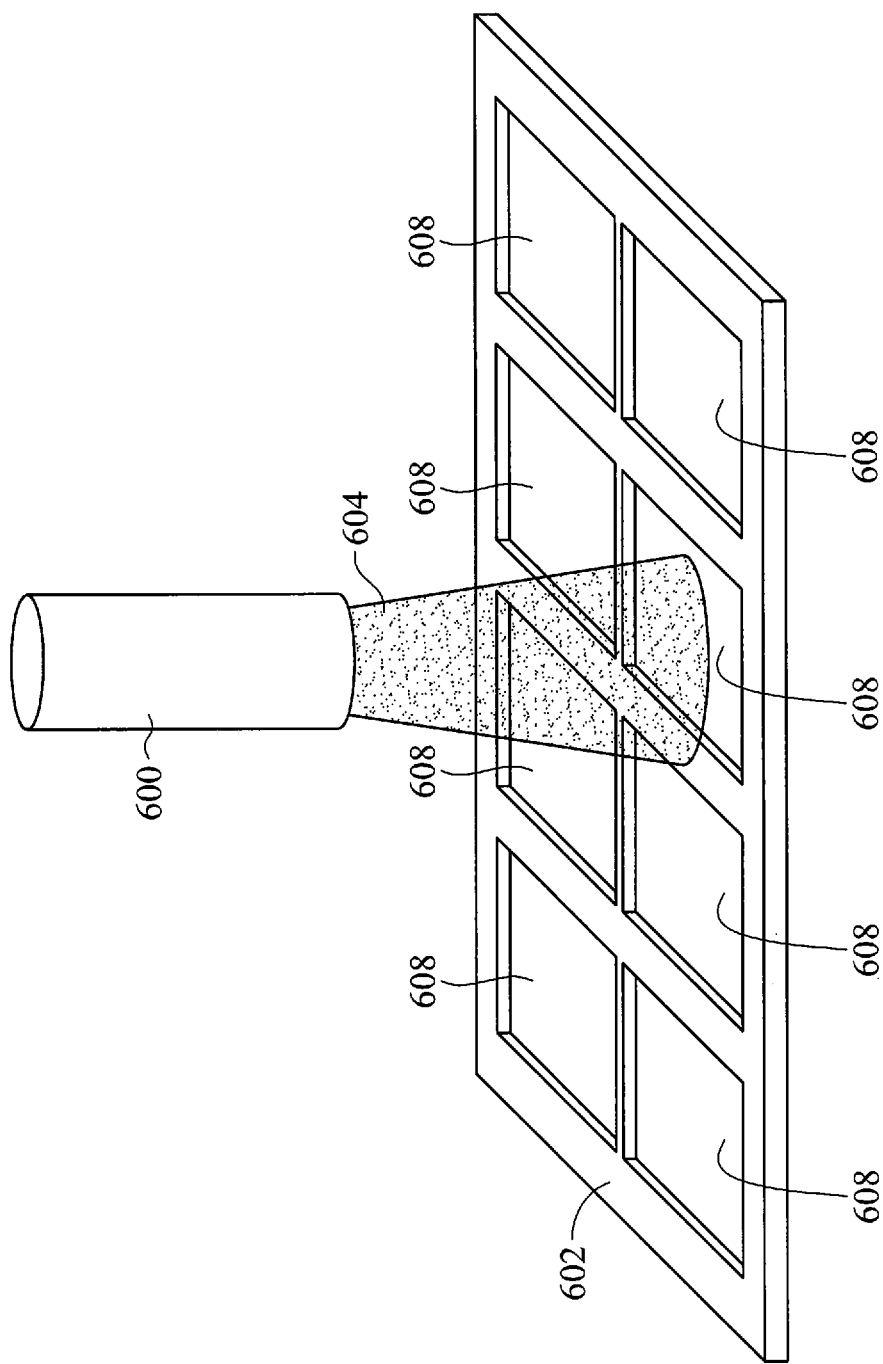
FIG. 6A is an illustration of an image sensor configured to produce image data characterizing a bottom plate of a die vessel, in accordance with some embodiments.

FIG. 6A is an illustration of an image sensor 600 configured to produce image data characterizing a bottom plate 602 of a die vessel, in accordance with some embodiments. As noted above, the bottom plate 602 of the die vessel may be the entire die vessel when the die vessel does not have a cover, or may be a bottom plate from which a cover is removed when the die vessel is a jig. In certain embodiments, the image sensor 600 may be configured to capture image data from the image sensor's field of view 604 that characterizes a part of the bottom plate 602 that includes concave receptacles 608 (e.g., pockets) in which individual dies may be placed (e.g., housed). These dies may be, optionally, further adhered in place in virtue of rotatable pin clamps that may contact a top surface of a die while the die rests with a bottom surface on the die vessel. Pin clamps will be discussed further below in connection with FIG. 7. Also, as will be discussed further below, this image data may be utilized to determine a distance between individual pins. In particular embodiments, a die vessel may have from 2 to 10 pins (e.g., dummy pins). In certain embodiments, the image data may be utilized to determine whether the pins are other than, for example, about 0.075 millimeters apart.

Figure 6B:
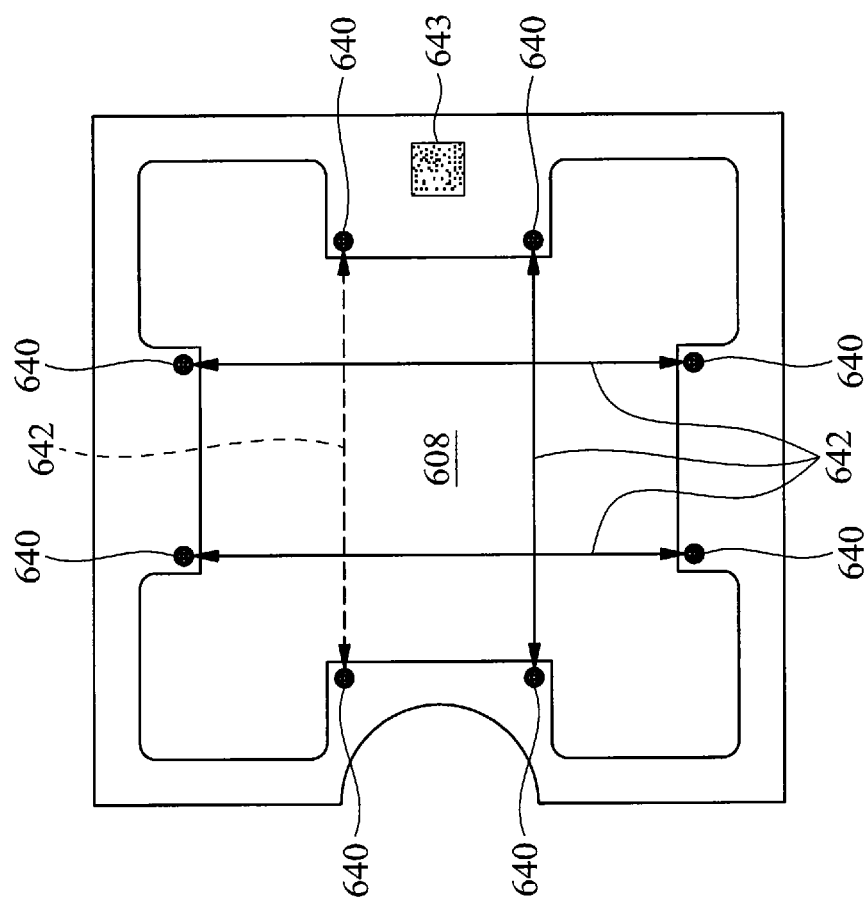
FIG. 6B is an illustration of one of the concave receptacles with pins, in accordance with some embodiments.

FIG. 6B is an illustration of one of the concave receptacles 608 with pins 640, in accordance with some embodiments. As noted above, the distance 642 between the pins 640 may be measured using an image sensor in certain embodiments. As illustrated, this distance 642 may traverse a corresponding pin on an opposite side of a concave receptacle 608. For example, the image data produced by the image sensor may be utilized to determine whether the pins are other than, for example, about 0.075 millimeters apart. Furthermore, as noted above, a die vessel cover sensor may be an image sensor configured to capture an image of the die vessel to determine whether it is a jig (e.g., with a cover) or a boat or tray (e.g., without the cover). A computer readable code or marking (e.g., die vessel identifier, such as a barcode (e.g., a one dimensional bar code or a two dimensional matrix bar code such as a QR code)) 643 on the die vessel may be read from the image of the die vessel and processed to determine whether the die vessel has a cover or not (e.g., whether it is a jig or a boat/tray). Further discussion of a die vessel (e.g., the bottom plate of a die vessel) is provided below in connection with FIG. 7.

FIG. 6C is an illustration of a line image sensor 650 configured to produce image data characterizing a bottom plate 652 of a die vessel, in accordance with some embodiments. As noted above, the bottom plate 652 of the die vessel may be the entire die vessel when the die vessel does not have a cover, or may be a bottom plate from which a cover is removed when the die vessel is a jig. In certain embodiments, the line image sensor 650 may be configured to capture image data from the image sensor's field of view in a one dimensional line 654 that characterizes a part of the bottom plate that includes concave receptacles 658 (e.g., pockets) in which individual dies may be placed (e.g., housed). The line image sensor 650 may be configured to determine whether there is warpage, or variations in curvature, along the field of view along the one dimensional line 654 of the line image sensor 650. For example, the line image sensor 650 may be part of a profilometer (e.g., a conventional profilometer that includes a charge coupled device (CCD) or complementary metal-oxide-semiconductor (CMOS) linear image sensor). In certain embodiments, the image data produced by the line image sensor 650 may be utilized to determine whether warpage of the bottom plate 652 is at or more than 200 micrometers from a planar orientation. In certain embodiments, the line image sensor 650 may be configured to characterize or detect warpage, or variations in curvature, that are at or less than 200 micrometers from a planar orientation.

Figure 7:
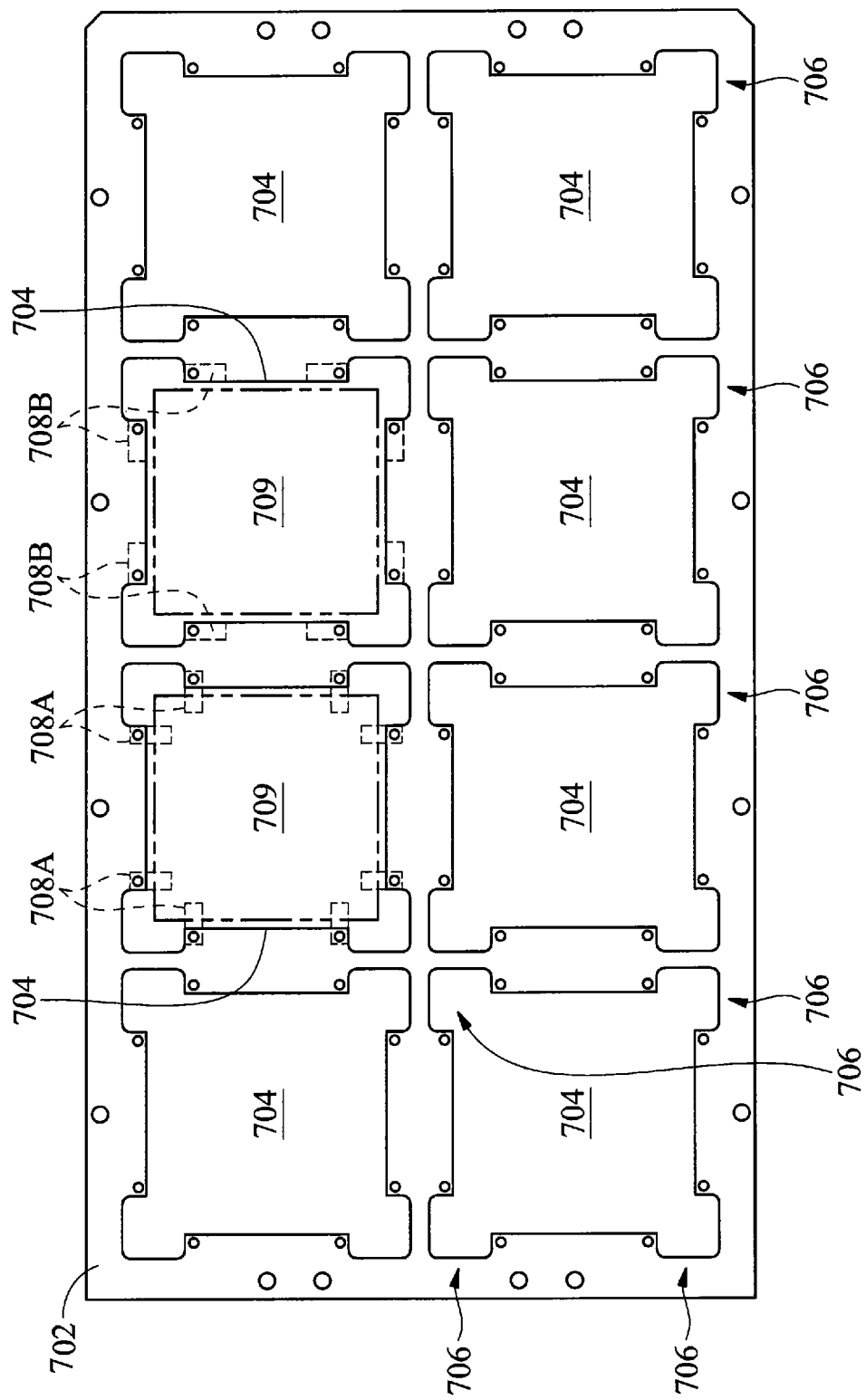
FIG. 7 is a schematic diagram of a bottom plate of a die vessel, in accordance with some embodiments.

FIG. 7 is a schematic diagram of a bottom plate 702 of a die vessel, in accordance with some embodiments. The bottom plate 702 may include a number of receptacles 704 in which to a die may be placed. For example, there may be eight receptacles 704, as illustrated in the embodiment of FIG. 7. Each of the receptacles may be substantially rectangular in shape with a further protrusion along the square corner portions 706 of a respective receptacle 704. Optionally, each of the square corner portions 706 may be adjacent to pins in which a pin brace 708A, 708B may be disposed. The pin braces 708A, 708B may be configured (e.g., rotated) to be anchored at the pin and to be disposed over a die when the die is to be transported using the die vessel and to be removed from over the die when the die is not to be transported using the die vessel. For example, pin brace 708A (drawn in phantom) illustrate how the pin brace 708A is disposed over a die 709 (drawn in phantom) when the die is to be transported using the die vessel 702. Also, pin brace 708B (drawn in phantom) illustrate how the pin brace 708B are not disposed over a die 709 when the die 709 is not to be transported using the die vessel (e.g., to be removed from the die vessel). In certain embodiments, the die vessel is not configured to hold a die while being processed by the integrated semiconductor die vessel workstation and thus the pin brace 708 is not disposed over any die during a die vessel work station process. In various embodiments, a gasket may be an intermediate structure between two other structures on the die vessel. For example, a gasket may be an intermediate structure between the pin brace 708A, 708B and the bottom plate 702.

In certain embodiments, a workstation includes: a cleaning station configured to clean a die vessel, wherein the die vessel is configured to secure a semiconductor die; an inspection station configured to inspect the die vessel after cleaning to determine whether the die vessel is identified as passing inspection; and a conveyor configured to move the die vessel between the cleaning station and the inspection station.

In certain embodiments, a system includes: a die vessel configured to secure a semiconductor die; a workstation configured to process the die vessel in an automated manner, the workstation comprising: a cleaning station configured to clean the die vessel; an inspection station configured to inspect the die vessel after cleaning to determine whether the die vessel is identified as passing inspection; and a conveyor configured to move the die vessel between the cleaning station and the inspection station, wherein the conveyor is configured to move the die vessel to a pass output port or a fail output port based on whether the die vessel is identified as passing inspection.

In certain embodiments, a method includes: receiving a die vessel at a cleaning station configured to clean the die vessel; receiving the die vessel at an inspection station configured to inspect the die vessel after cleaning to determine whether the die vessel is identified as passing inspection; and moving the die vessel along a conveyor between the cleaning station and the inspection station, wherein the conveyor is configured to move the die vessel to a pass output port or a fail output port based on whether the die vessel is identified as passing inspection.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A workstation, comprising:
    a disassembly station configured to receive a die vessel, determine whether the die vessel comprises a first type of die vessel or a second type of die vessel, and disassemble multiple parts of the die vessel when the die vessel comprises the first type of die vessel;
    a cleaning station configured to clean one or more parts of the die vessel, wherein the die vessel is configured to secure a semiconductor die;
    an inspection station configured to inspect the one or more parts of the die vessel after cleaning to determine whether the die vessel is identified as passing inspection; and
    a conveyor configured to move the one or more parts of the die vessel between the disassembly station, the cleaning station and the inspection station,
    wherein the disassembly station comprises a weight sensor configured to measure a weight of the die vessel, and wherein the disassembly station determines whether the die vessel comprises the first or second type of die vessel based on an output of the sensor.

2. The workstation of claim 1, wherein the conveyor is configured to move the die vessel to a pass output port or a fail output port based on whether the die vessel is identified as passing inspection.

3. The workstation of claim 2, wherein the pass output port is capable of interfacing with an automated material handling system.

4. The workstation of claim 1, wherein the die vessel is identified as passing inspection in response to no defects detected by the inspection station.

5. The workstation of claim 1, further comprising:
    an assembly station configured to assemble the multiple parts after inspection of the die vessel when the die vessel is determined to comprise multiple parts.

6. The workstation of claim 5, further comprising:
a drying station configured to dry the multiple parts.

7. The workstation of claim 6, wherein
the conveyor is configured to move the one or more parts of the die vessel from the disassembly station, to the cleaning station, to the drying station, to the inspection station and to the assembly station.

8. A system, comprising:
a die vessel configured to secure a semiconductor die;
a workstation configured to process the die vessel in an automated manner, the workstation comprising:
  a disassembly station configured to receive a die vessel, determine whether the die vessel comprises a first type of die vessel or a second type of die vessel, and disassemble multiple parts of the die vessel when the die vessel comprises the first type of die vessel;
  a cleaning station configured to clean one or more parts of the die vessel;
  an inspection station configured to inspect the one or more parts of the die vessel after cleaning to determine whether the die vessel is identified as passing inspection; and
  a conveyor configured to move the one or more parts of the die vessel between the disassembly station, the cleaning station and the inspection station, wherein the conveyor is configured to move the one or more parts of the die vessel to a pass output port or a fail output port based on whether the one or more parts of the die vessel is identified as passing inspection,
wherein the disassembly station comprises a weight sensor configured to measure a weight of the die vessel, and wherein the disassembly station determines whether the die vessel comprises the first or second type of die vessel based on an output of the sensor.

9. The system of claim 8, wherein the inspection station is configured to inspect the die vessel to determine a distance between two pins on the die vessel.

10. The system of claim 9, wherein the conveyor is configured to move the die vessel to the fail output port in response to the distance between the two pins not being a predetermined distance apart.

11. The system of claim 8, wherein the inspection station is configured to inspect the die vessel for warpage.

12. The system of claim 11, wherein the conveyor is configured to move the die vessel to the fail output port in response to the warpage being at or more than a predetermined threshold across the die vessel.

13. The system of claim 8, wherein the cleaning station and the inspection station both comprise wheels and is configured to be stationary when in use and moved using the wheels when not in use.

14. The system of claim 8, wherein the conveyor is a conveyor belt.

15. The system of claim 14, wherein the conveyor belt comprises a cleaning station portion and an inspection station portion that are physically separated from each other.

16. A workstation, comprising:
a disassembly station configured to receive a die vessel, determine whether the die vessel comprises a first type of die vessel or a second type of die vessel, and disassemble multiple parts of the die vessel when the die vessel comprises the first type of die vessel, wherein the disassembly station comprises a weight sensor configured to measure a weight of the die vessel, and wherein the disassembly station determines whether the die vessel comprises the first or second type of die vessel based on an output of the sensor;
a cleaning station configured to clean one or more parts of the die vessel, wherein the die vessel is configured to secure a semiconductor die;
an inspection station configured to inspect the one or more parts of the die vessel after cleaning to determine whether the die vessel is identified as passing inspection;
an assembly station configured to assemble the multiple parts after inspection of the die vessel when the die vessel is determined to comprise the first type of die vessel; and
a conveyor configured to move the one or more parts of the die vessel between the disassembly station, the cleaning station, the inspection station and the assembly station.

17. The workstation of claim 16, wherein the conveyor is configured to move the one or more parts of the die vessel to a pass output port or a fail output port based on whether the one or more parts of the die vessel is identified as passing inspection.

18. The workstation of claim 16, further comprising:
a drying station configured to dry the one or more parts of the die vessel,
wherein the conveyor is configured to move the one or more parts of the die vessel from the disassembly station, to the cleaning station, to the drying station, to the inspection station and to the assembly station.

19. The workstation of claim 16, wherein the at least one sensor comprises an image sensor configured to capture an image of the die vessel.

20. The workstation of claim 16, wherein the conveyor comprises a conveyor belt.

* * * * *